United States Patent [19]

Ri

[11] Patent Number: 5,110,791

[45] Date of Patent: May 5, 1992

[54] METHOD FOR PRODUCING OXIDE SUPERCONDUCTOR

[75] Inventor: Seigen Ri, Yokohama, Japan

[73] Assignee: Fujitsu Limited, Kawasaki, Japan

[21] Appl. No.: 584,345

[22] Filed: Sep. 18, 1990

[30] Foreign Application Priority Data

Sep. 18, 1989 [JP] Japan .................................. 1-241573
Jan. 29, 1990 [JP] Japan .................................. 2-016212

[51] Int. Cl.$^5$ ............................................. H01L 39/24
[52] U.S. Cl. .................................. 505/1; 204/192.24; 427/62; 505/731; 505/732
[58] Field of Search ............... 204/192.24; 505/1, 731, 505/734, 732, 737, 816, 818, 819; 427/62

[56] References Cited

U.S. PATENT DOCUMENTS 4,892,862  1/1990  Ogushi et al. ........................... 505/1
4,942,152  7/1990  Itozaki et al. ........................... 505/1

FOREIGN PATENT DOCUMENTS 0322619   7/1989  European Pat. Off. ............ 505/731
63-281321 11/1988  Japan ..................................... 505/1
1-12420   1/1989  Japan ..................................... 505/732

Primary Examiner—Aaron Weisstuch
Attorney, Agent, or Firm—Staas & Halsey

[57] ABSTRACT

A method for producing an oxide superconductor comprises the steps of: forming on a substrate a layer of elements deficient in at least one of the elements composing a desired oxide superconductor and immersing the layer formed substrate into a solution containing a supplementary element which is at least one of the deficient oxide superconductor composing elements.

19 Claims, 4 Drawing Sheets

METHOD FOR PRODUCING OXIDE SUPERCONDUCTOR

BACKGROUND OF THE INVENTION

1. Field of the Invention

This invention relates to a method for producing an oxide superconductor and more particularly to a method for producing an A-Ce-Cu-O type oxide superconductor (wherein A is a lanthanide element or a rare earth element) or a Bi oxide superconductor.

2. Description of the Related Art

Recently, attempts to apply a metal or alloy superconductor to a device have been made. Nevertheless, since the critical temperature Tc is very low, such a device could not be used in liquid helium. On the other hand, an oxide superconductor has a high Tc and has the ability to be used in liquid nitrogen.

As the oxide superconductor a hole injection type oxide superconductor such as the yttrium (Y) or the bismuth (Bi) type and an electron injection type oxide superconductor such as the $Ln_{2-x}Ce_xCuO_{4-y}$ type (wherein Ln is a lanthanide element) are well known.

The hole injection type oxide superconductor needs to be annealed in an oxidizing atmosphere. On the other hand, an electron injection type oxide superconductor needs to be annealed in a reducing atmosphere.

It is noted that the oxide superconductor is applied to an interconnection or wiring layer in an electrical device.

To produce the electrical device a reducing atmosphere is often used. Thus, the electron injection type oxide superconductor which needs annealing in a reducing atmosphere is often used.

A conventional oxide superconductor has been produced by a sputtering method, usually by using a sintered bulk material as a target.

For example, in the case of a $Ln_{2-x}Ce_xCuO_{4-y}$ type oxide superconductor, a sintered bulk material containing the elements Ln (lanthanide), Ce (cerium), Cu (copper), etc., is produced, and sputtering is effected by using the sintered bulk material as a target whereby the superconductor film is formed on a required substrate.

Since a conventional $LN_{2-x}Ce_xCuO_{4-y}$ type oxide superconductor film is produced by a sputtering method, Ce is contained therein in such a manner that it is solid-dissolved in Ln (wherein Ln is a lanthanide element). Therefore uniform addition of Ce or control of the addition thereof has been very difficult.

Furthermore, the film composition was found to contain easily varied phases such as $CeO_2$, $Ln_2O_7$ (wherein Ln is a lanthanide element), etc., other than superconducting $Ln_{2-x}Ce_xCuO_{4-y}$ and the superconducting properties of the obtained superconductor were deteriorated.

Further, in the case of a Bi type oxide superconductor such as $(Bi_{2-x-y}Pb_xSb_y)Sr_2Ca_2Cu_3O_{10}$ a sintered bulk material made of $Bi_2O_3$, $PbO$, $Sb_2O_3$, $SrCO_3$, $CaCO_3$ and $CuO$ is used as a target to perform sputtering. In the case of $(Bi_{2-x-y}Pb_xSb_y)Sr_2Ca_2Cu_3O_{10}$, Sb is contained in such a manner that it is solid dissolved in Bi. Addition of a required or constant amount of Sb is very difficult because the additional amount of Sb is small and Sb is easily aggregated. Thus, the composition of an obtained superconductor is changeable and $Sb_2O_3$ or an unidentified phase other than a phase of $(Bi_{2-x-y}Pb_xSb_y)Sr_2Ca_2Cu_3O_{10}$ is found.

SUMMARY OF THE INVENTION

It is an object of the present invention to provide a method for producing a superconductor having a stably uniform composition. It is another object of the present invention to provide a method for producing a superconductor in which one element which, in the previous methods, is uncontrollably added can be uniformly or controllably added thereto in a fixed amount.

There is provided a method for producing an oxide superconductor comprising the steps of:

forming on a substrate a layer of elements deficient in at least one of the elements composing a desired oxide superconductor and immersing said layer into a solution containing a supplementary element which is at least one of said deficient oxide superconductor composing elements.

According to the present invention the layer consists essentially of an A-Cu-0 type (wherein A is a lanthanide element or a rare earth element) compound.

Further according to the present invention the A of the A-Cu-0 type compound is preferably selected from La, Nd, Sm, Pr, Y, etc.

In the present invention, in the case where Ce is used as a supplementary element, a Ce containing solution is preferably selected from cerium nitrate $Ce(NO_3)_3$, cerium acetate $Ce(CH_3COO)_3$, cerium carbonate $Ce_2(CO_3)_3$, or cerium oxalate $Ce_2(C_2O_4)_3$, and the like.

There is further provided a method for producing an oxide superconductor comprising the steps of:

forming on a substrate a layer of elements composing an oxide superconductor and immersing said layer into a solution containing a supplementary element which is added to said elements composing said oxide superconductor.

According to the present invention, the layer preferably consists essentially of $(Bi_{2-x}Pb_x)Sr_2Ca_2Cu_3O_{10}$.

According to the present invention, in a case where Sb is used as a supplementary element, an Sb containing solution is preferably selected from an antimonyl chloride (SbOCl) and a chloro antimonate ($H_3SbCl_6$) solution.

According to the present invention, by saturating a layer of main oxide superconductor composing elements with a supplementary element by immersing the layer into the supplementary element containing solution, the supplementary element is uniformly added to the layer so that an oxide superconductor can be obtained. Thus, the occurrence of another phase which is not the superconductor phase is prevented.

Further according to the present invention, by controlling the concentration and temperature of the supplementary solution and by controlling the supplementary element-saturation time, the added amount of the supplementary element can be easily controlled.

PREFERRED EMBODIMENTS OF THE PRESENT INVENTION

Preferred embodiments will now be explained with reference to drawings.

Figure 1:
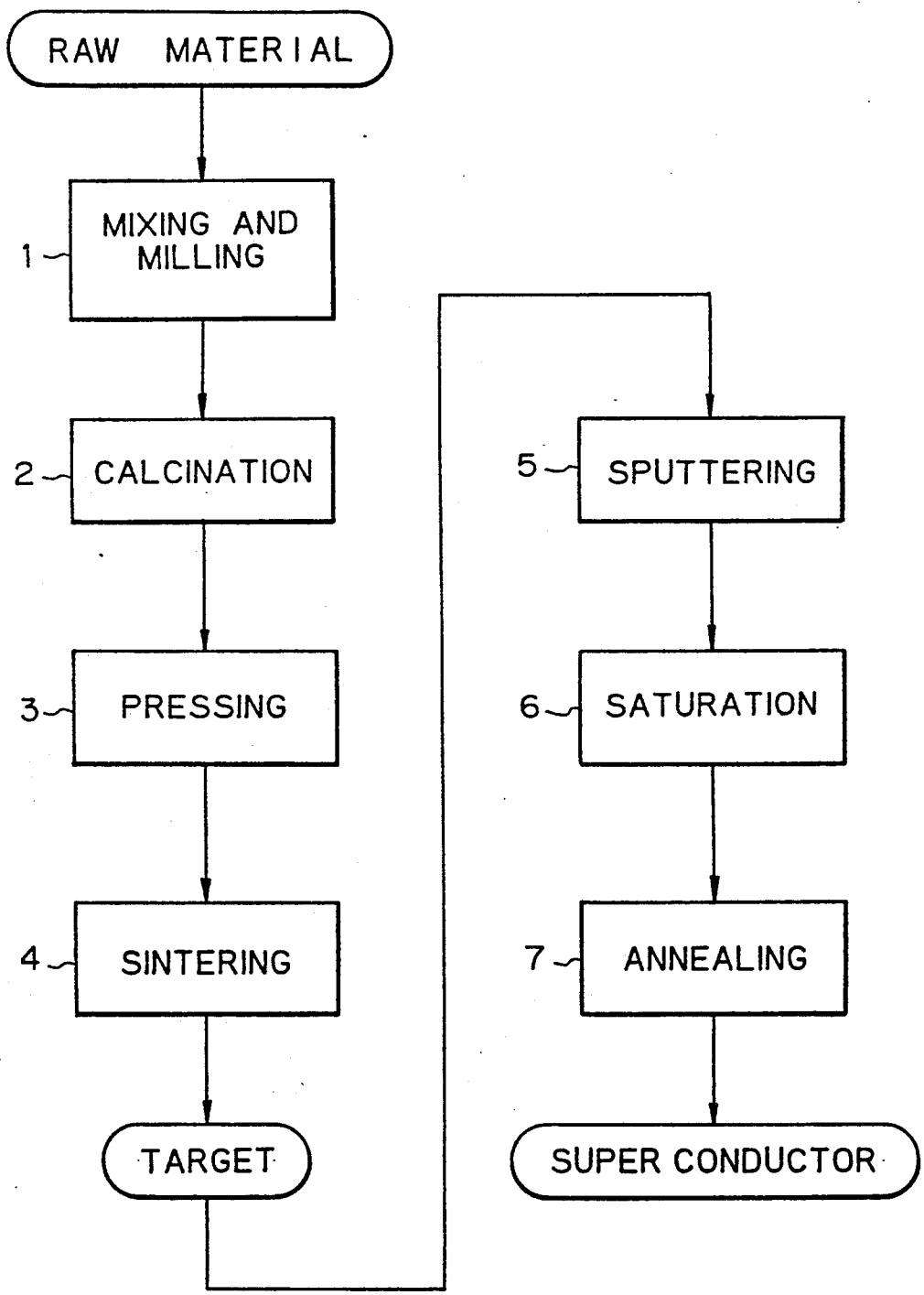
FIG. 1 is a flow chart showing a method of producing a superconductor according to the present invention.

FIG. 1 is a flow chart showing a method for producing an oxide superconductor according to the present invention.

First, a production process of $Nd_{2-x}Ce_xCuO_{4-y}$ will be explained. $Nd_2O_3$ powder and CuO powder raw materials are mixed and milled by using a ball mill (step 1). Subsequently, the mixed powder is calcined in an Ar(argon) atmosphere at a temperature of 850° to 950° C. for 10 to 30 hours (step 2). Then, the calcined product is subjected to pressing (step 3) and sintering at a temperature of 980° to 1200° C. for 10 to 30 hours in an Ar(argon) atmosphere (step 4) so that a sintered bulk target of $Nd_2O_3$ and CuO is formed.

Figure 2:
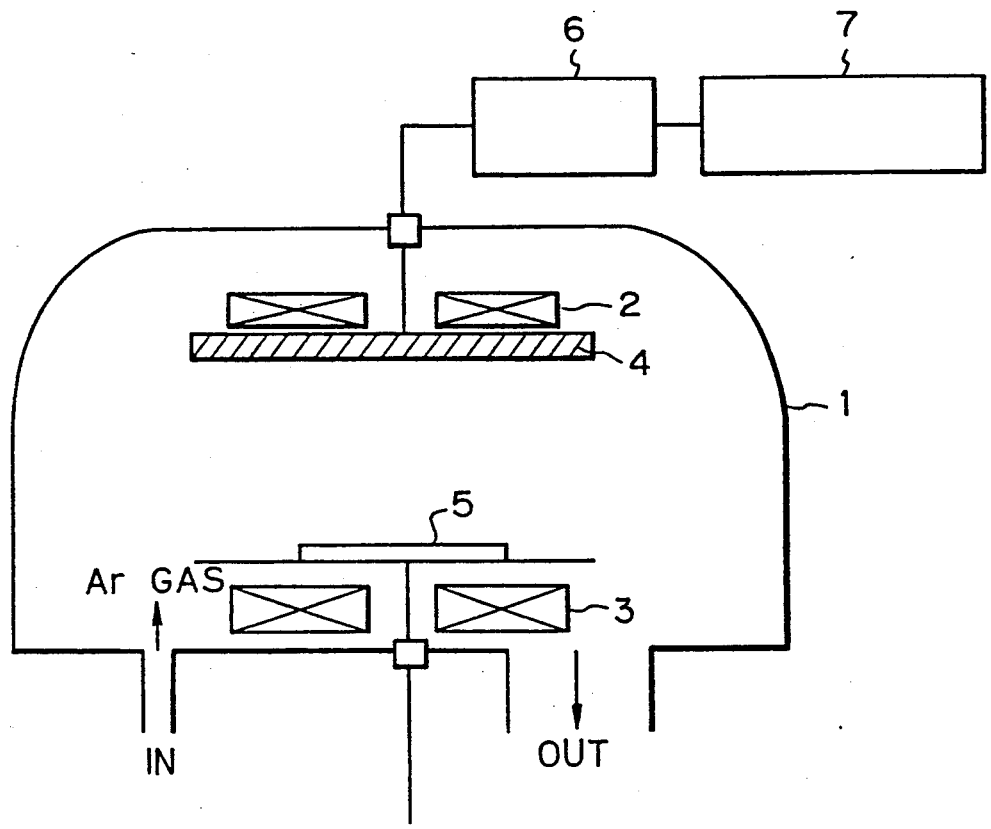
FIG. 2 is a schematic view showing a sputtering device according to the present invention.

After that, using the above target, sputtering is carried out by using a sputtering device shown in FIG. 2 (step 5).

In the sputtering device, a target 4 and a substrate 5 are provided in a chamber 1. Reference numerals 2 and 3 denote magnets, and reference numerals 6 and 7 denote a matching box and an rf power source, respectively.

Ar gas is supplied into the chamber 1. In the sputtering process, a MgO or PSZ (partially stabilized zirconia) substrate 5, which is heated to a temperature of 500° to 700° C., is used.

The sputtering is carried out in an Ar(argon) atmosphere of 0.1 torr so that an approximately 5000 Å thick $Nd_2CuO_4$ thin film is deposited on the substrate.

Figure 3:
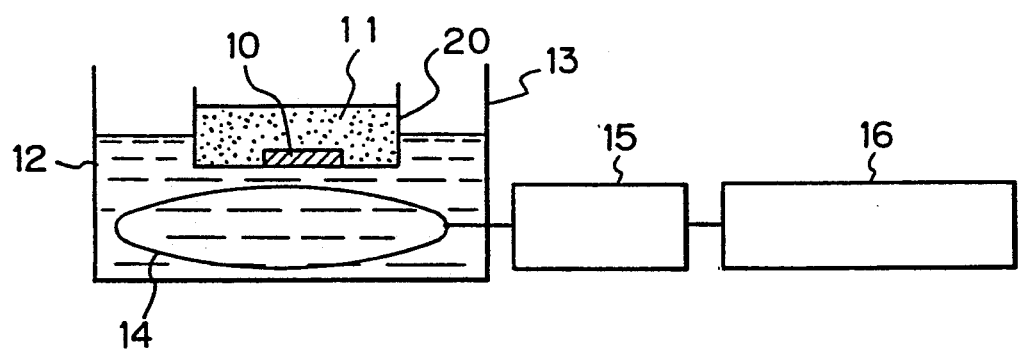
FIG. 3 is a schematic view showing a liquid saturation apparatus according to the present invention.

Subsequently, as shown in FIG. 3, the obtained substrate 10 is immersed into a Ce-containing solution 11 in a vessel 20.

The vessel is floated on hot water 12 contained in a constant temperature bath 13. The hot water 12 is heated by a heater 14 connected to a thermocouple 15, and power source 16. By the immersion, Ce is saturated in the $Nd_2CuO_4$ thin film (step 6). In the saturation process, cerium nitrate $(Ce(CNO_3)_3)$ was used as the dissolved substance of the Ce containing solution. As a solvent, ethyl alcohol $(C_2H_5OH)$ was used. In this case 0.4 g of cerium nitrate was added to 100 g of ethyl alcohol. The temperature of the constant temperature bath 13 was kept at 60° C. The Ce saturation was carried out for 15 hours.

In this saturation process, the amount of Ce added to the $Nd_2CuO_4$ thin film can be controlled by controlling the concentration and the temperature of the Ce solution and the saturation time.

Subsequently, the Ce saturated thin film is annealed at a temperature of 900° to 1100° C. for 10 to 20 hours in a reducing atmosphere such as nitrogen or argon, and the like (step 7), thereby forming an oxide superconductor thin film of $Nd_{2-x}Ce_xCuO_{4-y}$ (X=0.05).

Then, the temperature-resistivity properties of the $Nd_{2-x}Ce_xCuO_{4-y}$ thin film were measured. The measurement results are shown in FIG. 4.

Figure 4:
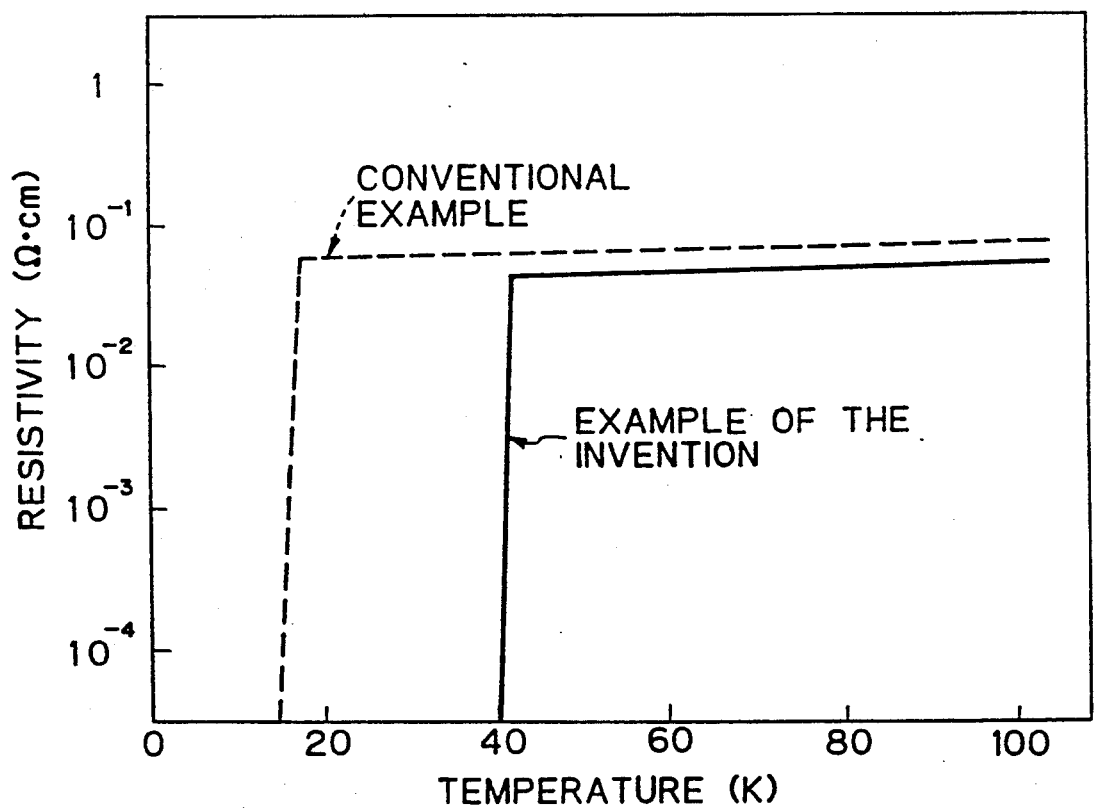
FIG. 4 is a graph showing the relationship between resistivity and temperature (° K) of a $Nd_{2-x}Ce_xCuO_{4-y}$ thin film.

As shown in FIG. 4, in the case of a $Nd_{2-x}Ce_xCuO_{4-y}$ superconductor thin film formed by a conventional sputtering process, the zero resistance temperature Tc is 5 to 15K, while in the case of this example, the zero resistance temperature Tc is 40K, which is higher than that in the above-mentioned conventional case. Thus the superconducting property was improved.

Next, a production process of $(Bi_{2-x}Pb_xSb_y)Sr_2Ca_2Cu_3O_{10}$ will be described.

A mixed powder of 7 g of $Bi_2O_3$, 17 g of $SrCO_3$, 25 g of $CaCO_3$, 19 g of CuO and 4 g of PbO is milled by a ball mill (step 1). Subsequently, the mixed powder is calcined in air or an oxygen atmosphere at a temperature of 800° to 880° C. for 10 to 30 hours (step 2).

Then, the calcined product is subjected to pressing (step 3) and sintering at a temperature of 830° to 910° C. for 10 to 30 hours in air or an oxygen atmosphere (step 4) so that a sintered bulk target made of such a product is formed.

After that, by using the above target sputtering is carried out in the sputtering device shown in FIG. 2 (step 5).

In the sputtering process, a MgO or PSZ substrate 5, which is heated to a temperature of 500° to 700° C., is used.

The sputtering is carried out in an oxygen atmosphere of 0.1 torr so that an approximately 5000 Å thick $(Bi_{2-x}Pb_x)Sr_2Ca_2Cu_3O_{10}$ thin film is deposited on the substrate.

Then, the obtained substrate is immersed into a Sb-containing solution to saturate Sb using the apparatus shown in FIG. 3. As a solution, SbOCl (antimonyl chloride), obtained by adding antimony chloride to water and hydrolyzing, is used. In this example, 95 g (0.4 mol) of $SbCl_3$ added to 100 g of water was used. The temperature of the constant temperature bath was kept at 50° C. The Sb saturation was carried out for 10 hours.

Subsequently, the Sb saturated thin film is annealed at a temperature of 820° to 1100° C. for 10 to 30 hours in an oxygen atmosphere (step 7) thereby forming an oxide superconductor thin film of $(Bi_{2-x-y}Pb_xSb_y)Sr_2Ca_2Cu_3O_{10}$ (Y=0.1).

Figure 5:
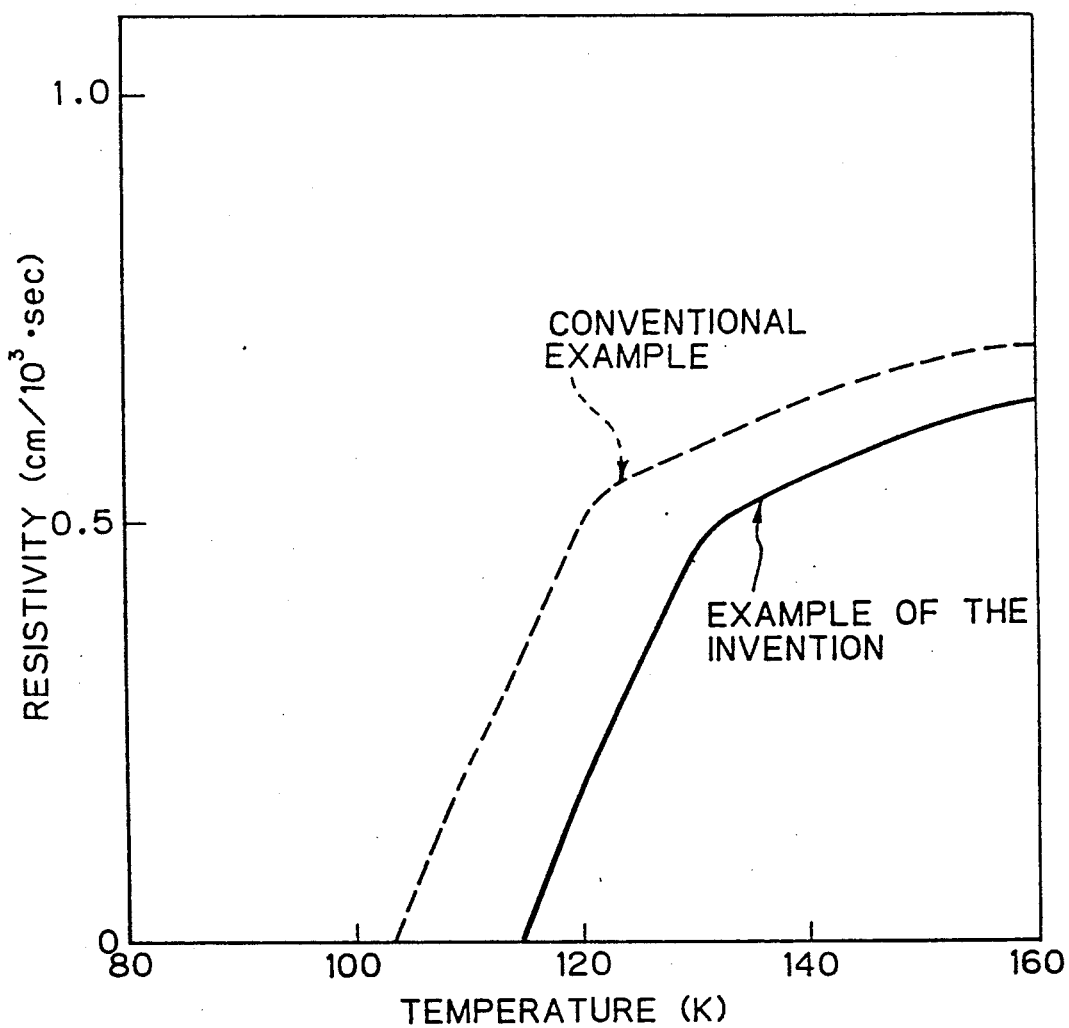
FIG. 5 is a graph showing the relationship between resistivity and temperature of (° K) a $(Bi_{2-x-y}Pb_xSb_y)Sr_2Ca_2Cu_3O_{10}$ thin film.

Then the temperature-resistivity properties of the $(Bi_{2-x-y}Pb_xSb_y)Sr_2Ca_2Cu_3O_{10}$ were measured. The measurement results are as shown in FIG. 5. As shown in FIG. 5, the zero resistance temperature Tc is about 115K, which is higher than that of the conventional example.

I claim:

1. A method for producing an oxide superconductor including a first element, said method comprising the steps of:
   (a) forming a layer on a substrate, said layer consists essentially of an A-Cu-O type compound, wherein A is a lanthanide element or a rare earth element, and said layer is deficient in at least the first element; and
   (b) immersing said layer formed in step (a) into a solution containing a supplementary element which is the first element.

2. A method according to claim 1, wherein, after step (b), an annealing step is carried out.

3. A method according to claim 2, wherein said annealing step is carried out in a reducing atmosphere.

4. A method according to claim 1, wherein said layer is formed by a sputtering method.

5. A method according to claim 1, wherein A is selected from a group consisting of La, Nd, Sm, Pr, and Y.

6. A method according to claim 1, wherein said supplementary element is not a skeletal element of the oxide superconductor.

7. A method according to claim 6, wherein said supplementary element is Ce.

8. A method according to claim 7, wherein said A-Cu-O type compound is $Nd_2CuO_{4-y}$.

9. A method according to claim 1, wherein said A-Cu-O type compound is $Nd_2CuO_{4-y}$.

10. A method according to claim 9, wherein said $Nd_2CuO_{4-y}$ layer is saturated with a Ce containing solution so that a $Nd_{2-x}Ce_xCuO_{4-y}$ compound is formed.

11. A method according to claim 10, wherein said Ce containing solution is selected from a group consisting of $Ce(NO_3)_3$, $Ce(CH_3COO)_3$, $Ce_2(CO_3)_3$ and $Ce_2(C_2O_4)_3$.

12. A method according to claim 9, wherein said $ND_2CuO_{4-y}$ layer is formed by a sputtering process in a reducing atmosphere.

13. A method for producing an oxide compound superconductor comprising elements including a first element, said method comprising the steps of:

(a) forming a layer on a substrate, said layer comprising said elements except for at least said first element; and (b) immersing said layer formed in step (a) into a solution containing a supplementary element which is the first element.

14. A method according to claim 13, wherein after step (b), an annealing step is carried out.

15. A method according to claim 13, wherein said layer consists essentially of $(Bi_{2-x}Pb_x)Sr_2Ca_2Cu_3O_{10}$.

16. A method according to claim 15, wherein said $(Bi_{2-x}Pb_x)Sr_2Ca_2Cu_3O_{10}$ layer is saturated with a Sb containing solution so that a $(Bi_{2-x-y}Pb_xSb_y)Sr_2Ca_2Cu_3O_{10}$ compound is formed.

17. A method according to claim 16, wherein said Sb containing solution is selected from a group consisting of $SbCl_3$, $SbOCl$ and $H_3SbCl_6$.

18. A method according to claim 15, wherein said supplementary element is Sb.

19. A method according to claim 13, wherein said supplementary element is Sb.

* * * * *